(12) United States Patent
Manger et al.

(10) Patent No.: US 7,005,240 B2
(45) Date of Patent: Feb. 28, 2006

(54) METHOD FOR FORMING A HARD MASK IN A LAYER ON A PLANAR DEVICE

(75) Inventors: Dirk Manger, Dresden (DE); Matthias Goldbach, Dresden (DE)

(73) Assignee: Infineon Technologies AG, Munich (DE)

( * ) Notice: Subject to any disclaimer, the term of this patent is extended or adjusted under 35 U.S.C. 154(b) by 283 days.

(21) Appl. No.: 10/370,857

(22) Filed: Feb. 20, 2003

(65) Prior Publication Data

US 2003/0157436 A1    Aug. 21, 2003

(30) Foreign Application Priority Data

Feb. 20, 2002   (DE) ............................... 102 07 131

(51) Int. Cl.
*G03C 5/00*    (2006.01)

(52) U.S. Cl. .................. 430/313; 430/311; 430/314; 430/316; 430/318; 216/41

(58) Field of Classification Search ........... 430/311, 430/313, 314, 316, 317, 318; 216/41
See application file for complete search history.

(56) References Cited

U.S. PATENT DOCUMENTS

| 6,071,653 A | 6/2000 | Lin |
| 2003/0027059 A1 * | 2/2003 | Schweeger ............... 430/5 |

* cited by examiner

*Primary Examiner*—John A. McPherson
*Assistant Examiner*—Daborah Chacko-Davis
(74) *Attorney, Agent, or Firm*—Laurence A. Greenberg; Werner H. Stemer; Ralph E. Locher (57) ABSTRACT

A hard mask is produced from spacer structures. The spacer structures are formed from a conformal deposition on elevated structures produced lithographically in a projection process. The conformal deposition is etched back laterally on the elevated structures resulting in the spacer structures. The elevated structures between the spacer structures are subsequently etched away, so that the spacer structures remain in an isolated fashion as sublithographic structures of a hard mask with a doubled structure density compared with that originally produced in lithographic projection. In a regularly disposed two-dimensional array of structures in the hard mask for forming trenches—for instance for trench capacitors—the method achieves a doubling of the structure density in the array. A further iteration step is formed by forming further spacer structures on the first and second spacer structures, thereby achieving an even higher increase in structure density in the hard mask.

26 Claims, 6 Drawing Sheets

METHOD FOR FORMING A HARD MASK IN A LAYER ON A PLANAR DEVICE

BACKGROUND OF THE INVENTION

Field of the Invention

The present invention relates to a method for forming a hard mask in a layer on a planar device, in particular semiconductor wafers, masks or flat panels.

In the fabrication of integrated circuits it is generally the aim to achieve the highest possible number of components on a predetermined substrate area. In particular in the fabrication of memory modules, a higher clock frequency and hence a faster module can be made available by shortening lengths of interconnects. The production of smaller structures is nowadays achieved essentially using optical lithography methods. The minimum achievable or resolvable structure width is $$b_{min} = x \times \lambda / NA,$$

where $b_{min}$ is the minimum resolvable structure width, x is a parameter which describes the lithography technique, $\lambda$ is the wavelength of the light for the optical projection, and NA is the numerical aperture of the projection system. Integrated circuits produced at the present time can be fabricated with minimum resolvable structure widths of 110 nm. However, in order to attain for example the 70 nm technology generation, a transition must be realized in light wavelengths used in the exposure apparatuses, to those apparatuses where $\lambda=157$ nm. However, such exposure apparatuses are currently still in development and are not available for production at this time.

Such leaps in technology are usually associated with high costs. The transition to the 157 nm exposure apparatuses requires, by way of example, the use of exotic lens materials such as $CaF_2$, which equally have first to be developed. A further problem is posed by the processes connected with the exposure step. A decrease in the exposure wavelength also leads to a necessary limitation of the permissible focus range for an exposure. This requirement in turn entails the use of even thinner resists for the exposure.

In addition to the costs that are necessary for a leap to the next technology generation, however, the time taken to implement the leap in technology also increases on account of the complexity of the mutual dependencies of the respectively different process techniques. Although it is possible, with the aid of the process steps that usually follow the lithographic projection in the fabrication sequence, to produce feature sizes below the resolution limit—for instance by spacer deposition onto the side areas surrounding a gap in order to limit the gap size—a structure density that can be produced, and which is composed of a gap width and a line width in the example, cannot thereby be increased.

SUMMARY OF THE INVENTION

It is accordingly an object of the invention to provide a method for forming a hard mask in a layer on a planar device which overcomes the above-mentioned disadvantages of the prior art methods of this general type, which requires a small structure spacing in conjunction with low costs and a short development time.

With the foregoing and other objects in view there is provided, in accordance with the invention, a first method for forming a hard mask in a first layer on a planar device. The first method includes the steps of depositing a second layer on the first layer, using a lithographic projection process for forming at least one elevated first structure from the second layer disposed above the first layer, conformally depositing a third layer on the elevated first structure and on the first layer, etching back the third layer for forming a first spacer structure and a second spacer structure each disposed on a respective side area of the elevated first structure, and etching the second layer selectively with respect to the first and third layers to remove the elevated first structure disposed between the first and second spacer structures, resulting in the hard mask being formed from the first and second spacer structures.

With the foregoing and other objects in view there is provided, in accordance with the invention, a second method for forming a hard mask in a first layer on a planar device. The second method includes the steps of depositing a fourth layer on the first layer, using a lithographic projection process for forming a hole structure in the fourth layer, conformally depositing a third layer, etching back the third layer for forming a first spacer structure and a second spacer structure on a respective side area of the hole structure, depositing and filling the hole structure with a second layer, planarizing the second layer, etching the fourth layer selectively with respect to the first, second and third layers for forming an elevated first structure enclosed by the first and second spacer structures on the side areas, and etching the second layer selectively with respect to the first and third layers for removing the elevated first structure between the first and second spacer structures, resulting in the hard mask being formed from the spacer structures.

According to the present invention, structures are formed in lithographic projection steps, which structures naturally have a structure width above the resolution limit of the projection apparatus respectively used. Spacers are subsequently formed laterally on these structures, which spacers may afterward, through removal of the structure formed lithographically, themselves in turn serve as a hard mask in the form of isolated structures. The structure width of the spacer structures is given by the layer thickness during the deposition of the third layer, in which case, through the conformal deposition, for instance in a CVD, LPCVD or ALD method, in particular on the side areas of an existing elevated structure, it is necessary to measure the thickness of the deposition parallel to the surface of the substrate used. Since the thicknesses of deposited layers may be a few nanometers, it is also possible, in particular, to produce structure widths in the sublithographic range, i.e. to produce structure widths below the minimum resolution limit of the projection system.

Moreover, since spacers are formed on a respective side of a line formed lithographically, that is to say the elevated structures or the hole structures, what is advantageously achieved is the production of two identical structures (in each case both elevated or both as a hole structure) in an area region which, by lithographic projection, could accommodate just a single structure produced. Consequently, in comparison with the prior art, the present invention achieves a miniaturization of structures down into the sublithographic range in conjunction with an increase in the structure density on the substrate of a planar device. Moreover, since this is done using simple process engineering, a considerable cost and time advantage results from the application of the present invention compared with the development of higher-resolution exposure techniques for planar devices such as, for instance, wafers or masks.

The two methods according to the invention differ in that, in the first method, using lithographic techniques, the spacer structures are formed on the side areas of an elevated structure, while in the second method hole structures are formed, the spacer structures being formed on the inner side areas of the hole structures. However, the elevated structures are attained in the second method, too, if the holes provided with the spacer structures are filled and the layer originally surrounding the holes is removed. Once this state has been reached, the sequence in the two methods is essentially identical.

In a further refinement, a fifth layer deposited conformally on the first layer and the spacer structures is etched back after the removal of the structures produced lithographically between the now isolated spacer structures. The first and second spacer structures then again act as a master structure for forming a third and fourth and, respectively, fifth and sixth spacer structure on a respective side of the first and second spacer structures. As a result, the structure width of the spacer structure that is composed of the first, third and fourth spacer structures, for example, can be varied in this method step. It thus becomes possible, in an advantageous manner, to adapt the line to gap ratio in a dense periodic grid of lines.

In a further refinement, the spacer structure formed first, i.e. the first or second spacer structure, is removed from the composite spacer structure. This step corresponds to a further iteration for doubling the number of structures per predetermined substrate area. Even further iteration steps are possible. In a further refinement, the first layer is essentially composed of silicon nitride, the second layer is essentially composed of $SiO_2$ and the third layer is essentially composed of polysilicon. The choice of these assignments to the three layers ensures a high selectivity for the respective etching steps and hence a high quality of the respective structure formation. According to the invention, it is also possible to exchange the assignments of the constituents to the layers.

However, the choice of silicon nitride for the first layer affords the particular advantage of serving as an etching stop for an end point identification during isotropic or anisotropic etching. The spacer structures are advantageously etched back in an anisotropic etching process.

In a further refinement, the third and fifth layers essentially contain the same material, with the advantage that the composite spacer structure is more resistant or more stable with respect to subsequent etching steps.

In a further refinement, the first and second or third to sixth spacer structures or the spacer structures composed thereof are produced with a structure width that lies below the minimum resolution limit of the lithographic projection apparatus.

In accordance with an added mode of the invention, during the lithographic projection process, an elevated second structure is formed from the second layer. The elevated first and second structures have a given width and a mutual spacing there-between, the mutual spacing not being less than the given width and not being more than three times the given width.

In accordance with an additional mode of the invention, there are the steps of carrying out the depositing of the third layer with a first thickness, and carrying out the depositing of the fifth layer with a second thickness. The first and second thicknesses are implemented in a manner dependent on the given width and the mutual spacing. The first thickness is formed to be essentially half a difference between the mutual spacing and the given width of the first and second structure. The second thickness is formed to be essentially an eighth of a difference between three times the given width and the mutual spacing.

In accordance with a further mode of the invention, during the lithographic projection process, elevated second, third and fourth structures are formed from the second layer. The elevated first to fourth structures are not disposed contiguously on the first layer and the elevated first structure has, in a first direction, a given spacing with respect to the elevated second structure and, in a second direction substantially perpendicular to the first direction, having the given spacing with respect to the elevated third structure. The etching of the second layer step is performed to the first to fourth structures in a same way to form a hole structure enclosed by the third to sixth spacer structures of the fifth layer in the hard mask.

In accordance with another mode of the invention, a silicon substrate is provided and the first layer bears on the silicon substrate and is formed of silicon nitride. The second layer is formed from polysilicon, and the third layer and the fifth layer are formed from silicon oxide. The hard mask transferred to the first layer is used in an etching step for forming trench capacitors in a memory cell array.

In accordance with the invention, the planar device is a semiconductor wafer, a mask, or a flat panel.

In accordance with a concomitant feature of the invention, the step of etching the first layer selectively with respect to the third layer, is performed so that the first and second spacer structures are transferred to the first layer for forming a further hard mask.

Other features which are considered as characteristic for the invention are set forth in the appended claims.

Although the invention is illustrated and described herein as embodied in a method for forming a hard mask in a layer on a planar device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Referring now to the figures of the drawing in detail and first, particularly, to FIG. 1 thereof, there is shown a first exemplary embodiment of a method according to the invention with reference to a cross section through a semiconductor wafer. Situated on a substrate 5, which is essentially composed of monocrystalline silicon, is a first layer 10, which essentially contains silicon nitride. A second layer 20 made of silicon oxide ($SiO_2$) is deposited thereon. The semiconductor wafer coated in this way is coated with a resist 30 in order to carry out a lithographic projection step, the resist being exposed in a projection step in order to produce structures 21. The exposed parts are developed and removed (FIG. 1A), so that the exposed structures are transferred to the second layer 20 in a subsequent etching step (FIG. 1B).

In the present exemplary embodiment, the structure 21 of the second layer 20 has a spacing 27 from a nearest further elevated structure 23 of the second layer 20, which spacing is equal to three times the minimum resoluble structure width of the projection apparatus, i.e. 3 F, where $F=b_{min}$. A structure width 28 of the structures 21, 23 is embodied at the resolution limit with 1 F in the example.

Figure 1A:
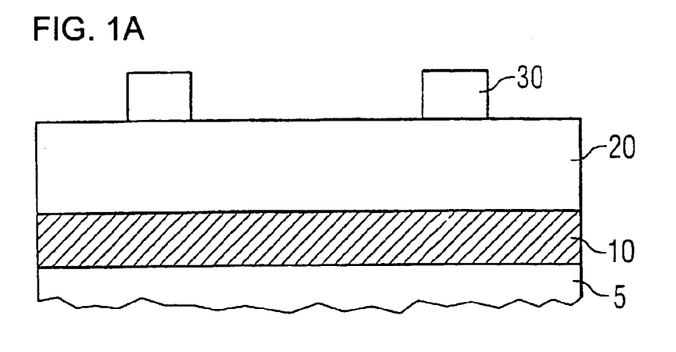
FIGS. 1A–1D are diagrammatic, sectional views of a first exemplary embodiment of a method according to the invention for forming a hard mask with doubled structure density.
Figure 1B:
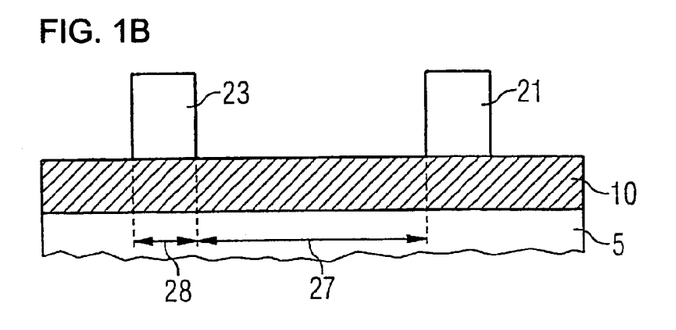
Figure 1C:
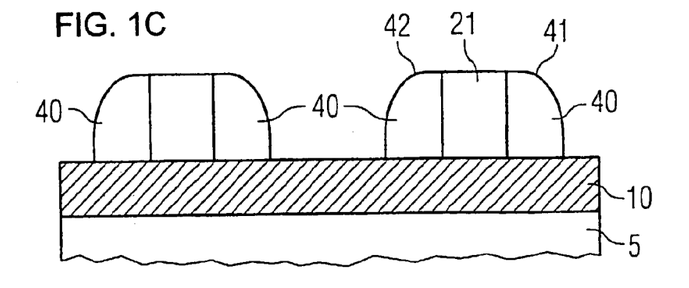

A third layer 40 made of polysilicon is subsequently deposited onto the silicon nitride layer 10 and the structures 21, 23. By etching back as far as an etching stop with end point identification on the silicon nitride layer 10, the third layer 40 is removed from the structures 21, 23 and the silicon nitride layer 10, except at those locations at which it has a vertical orientation bearing conformally on side areas of the structures 21, 23. This region is left behind as spacer structures 41, 42 in the anisotropic etching-back step (FIG. 1C).

In a further etching step, the silicon oxide of the second layer 20 is removed selectively with respect to the silicon nitride of the first layer 10 and the polysilicon of the third layer 40 between the spacer structures 41, 42. The spacer structures 41, 42 then lie in an isolated manner on the first layer of the silicon nitride layer 10. The spacer structures 41, 42 have a structure width 48 corresponding to the deposition thickness of the polysilicon for forming the third layer 40 (FIG. 1D).

The grid width of the structures 21, 23 produced lithographically is composed of the structure width 28 and the structure spacing 27 of the structures 21, 23. It is thus 4 F in the present example. Through a suitable choice of the deposition thickness—corresponding approximately to the minimum resolvable structure width 1 F—the structure width 48 of the spacer structures 41, 42 is also about 1 F. However, the mutual spacing of the spacer structures 41, 42 is thus also about 1 F. Consequently, given an approximately identical structure width 28, 48 of lithographically produced elevated structures 21, 23 and spacer structures 41, 42, the grid width of 4 F can be reduced to a value of 2 F for the hard mask formed by the spacer structures 41, 42.

A particular advantage arises, then, by virtue of the fact that lines with a grid width of less than 2 F can be fabricated according to the present invention. In this case, a grid having a grid width of 2 F is fabricated by conventional lithographic methods, but the line structures may also have a width of less than 1 F and the gap structures may have a width of greater than 1 F. The lines are somewhat overexposed in this case. It is thus possible to dispense with the double spacer technique in a restricted process window.

Figure 1D:
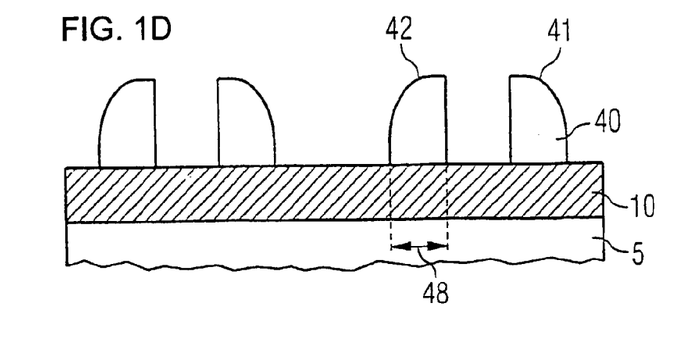

In this case, the spacer structures 41, 42 either themselves constitute the hard mask or the latter is formed by an anisotropic etching step for transferring the spacer structures 41, 42 to the first layer 10 made of silicon nitride (FIG. 1D).

A further exemplary embodiment is shown in FIGS. 2A–2D. In this example, a particularly advantageous effect is achieved through a suitable choice of deposition thicknesses in different steps of the spacer formation. In order to provide a better understanding, the method sequence will be described.

Figure 2A:
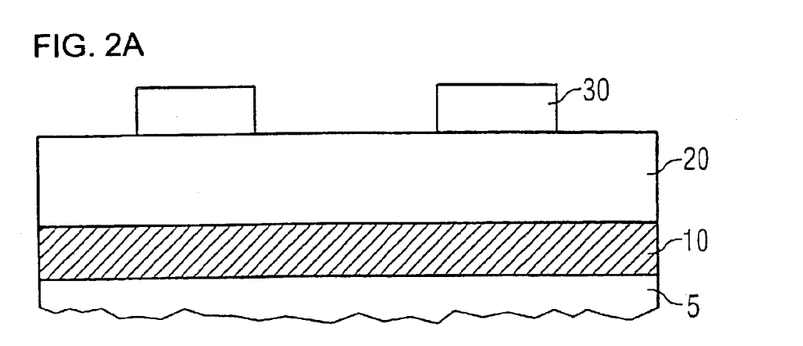
FIGS. 2A–2D are sectional views of a second exemplary embodiment of the method according to the invention for forming the hard mask with doubled structure density with an identical width of lines and gaps.
Figure 2B:
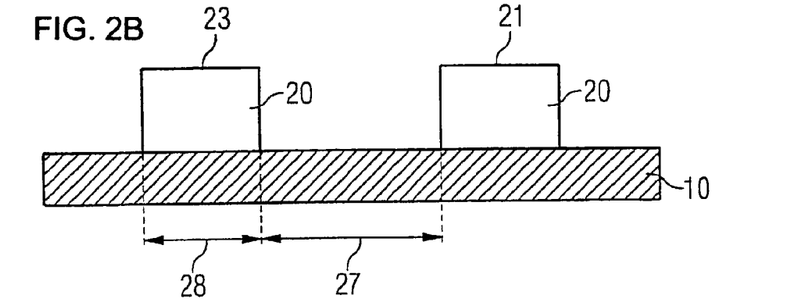

In a manner similar to that illustrated in FIGS. 1A and 1B, according to FIGS. 2A and 2B, the monocrystalline silicon substrate 5 is coated with the first layer 10 made of silicon nitride and the second layer 20 made of silicon oxide ($SiO_2$) and subsequently coated with the resist layer 30, which, for the formation of the structures 21, 23, is exposed, developed and etched in order to transfer structures to the second layer 20. It is an object of the present example to produce a dense structure of lines and gaps in which the gap and line widths are in an identical ratio to one another. The structure width 28 and the structure spacing 27 of the elevated structures 21, 23 produced lithographically are initially arbitrary, but must meet the following conditions: three times the structure width 28 must be more than the structure spacing 27, but the structure width 28 must not be greater than the structure spacing 27. If f is the structure spacing 27, then the following holds true:

$$F<f<3F.$$

Figure 2C:
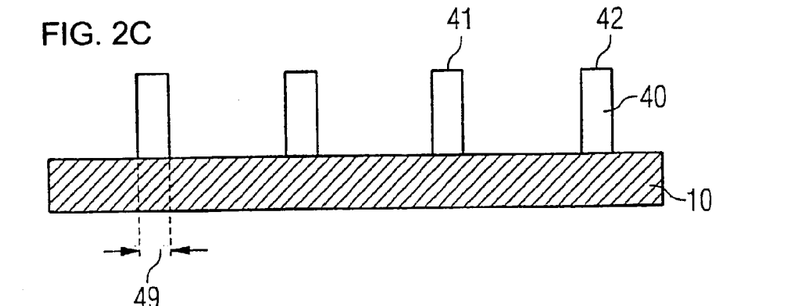
Figure 2D:
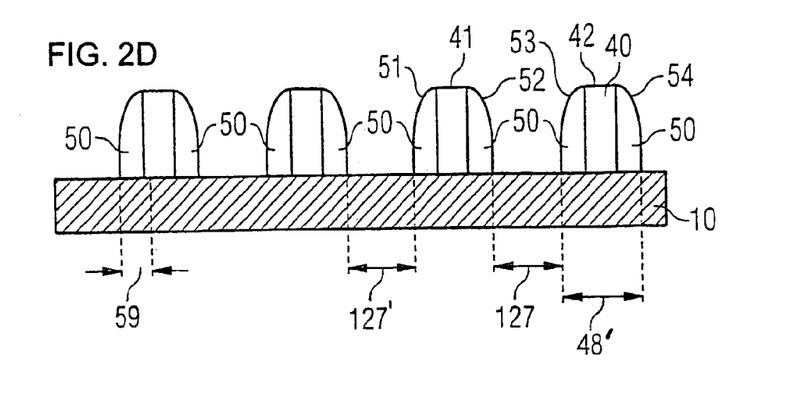

As in the previous example, in a deposition step, the spacer structures 41, 42 are then formed from a third layer 40 made of polysilicon, by anisotropic etching back. The structure width 48 of the spacer structures 41, 42 corresponds to the deposition thickness 49. The second layer 20 is subsequently removed in a selective etching step (FIG. 2C). Through the deposition of a fifth layer 50, further spacer structures, for instance third, fourth, fifth and sixth spacer structures 51 to 54, are formed on the existing spacer structures 41, 42 by polysilicon once again being deposited conformally with a deposition thickness 59 and etched back. The structure width 48 is thus enlarged into a new structure width 48', since at least one of the resulting spacer structures is composed of the originally second spacer structure 42, the fifth spacer structure 53 formed on its left-hand side, and the sixth spacer structure 54 formed on its right-hand side. The structure width 48' then amounts to the sum of the deposition thickness 49, of the third layer 40, and twice the deposition thickness 59 of the fifth layer 50, which are both formed from polysilicon.

An identical width ratio of lines and gaps can be achieved by choosing the deposition thicknesses 49, 59 as follows: if d1 is the deposition thickness 49 and d2 the deposition thickness 59, then the following holds true:

$$d1=\tfrac{1}{2}(f-F); \text{ and}$$

$$d2=\tfrac{1}{8}(3F-f).$$

A condition is that in order to form spacer structure spacings 127, 127' of essentially the same magnitude, as early as during the lithographic projection or in the design of the mask structures for projection onto a wafer, the structure widths 28 are less than the structure spacing 27 by precisely twice the deposition thickness 49 of the third layer 40.

Figure 3A:
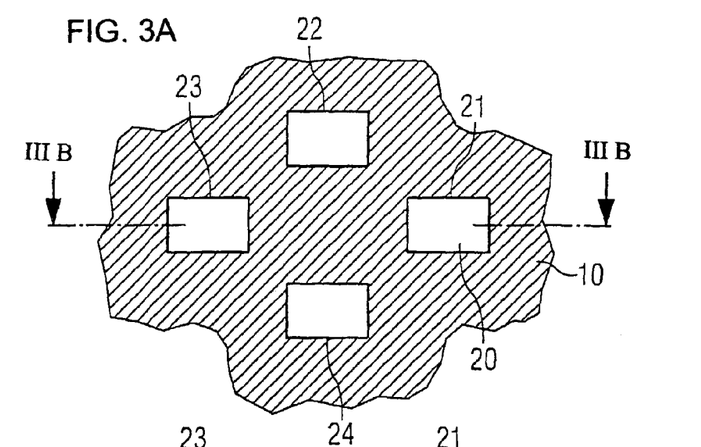
FIGS. 3A, 3C, and 3E are plan views of a third exemplary embodiment of the method according to the invention for forming the hard mask with regular configurations of holes for patterning trenches in a memory cell array.
Figure 3B:
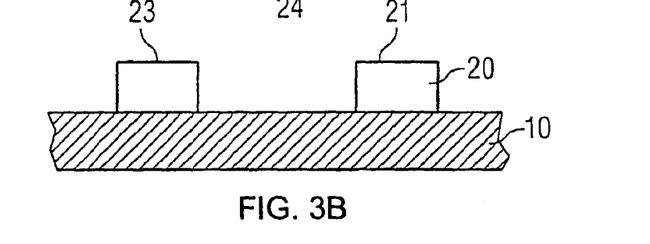
FIGS. 3B, 3D, and 3F are sectional views of the third exemplary embodiment of the method according to the invention for forming the hard mask with the regular configurations of holes for patterning trenches in a memory cell array.
Figure 3C:
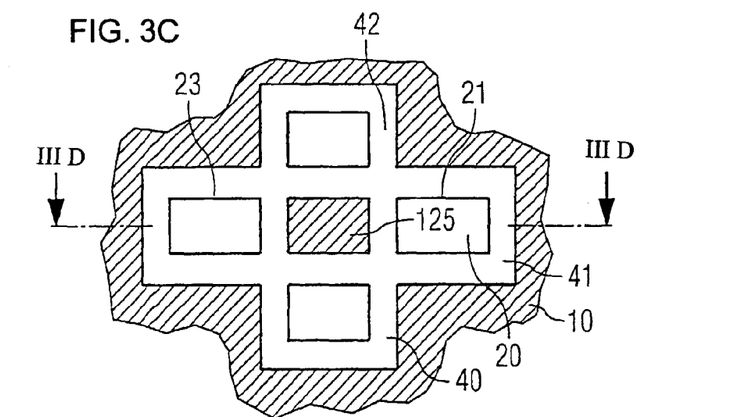
Figure 3D:
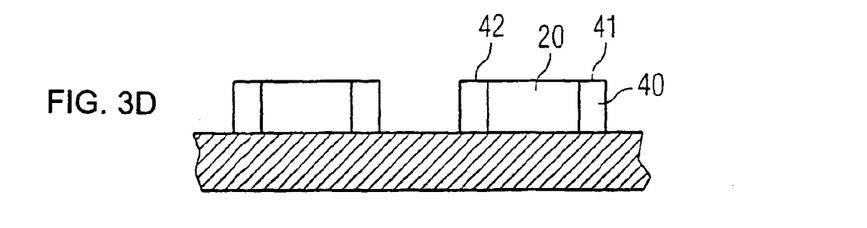

The formation of a hard mask for patterning a dense, regular array of trenches is shown in FIGS. 3A–4F. FIG. 3A shows as a starting point a configuration of four elevated structures 21–24 on the first layer 10 made of silicon nitrite, the so-called pad nitrite. The elevated structures 21 to 24 are composed e.g. of polysilicon. FIG. 3A is a plan view and FIG. 3B is a cross-sectional illustration taken along the line IIIB—IIIB shown in FIG. 3A. In a manner similar to that in the previous examples, the third layer 40 made of silicon oxide is deposited conformally onto the second layer 20—forming the elevated structures 21–24—and etched back, so that the structures 21–24 are enclosed by the spacer structures 41, 42, which—as can be seen in the plan view of FIG. 3C—are connected to one another.

Figure 3E:
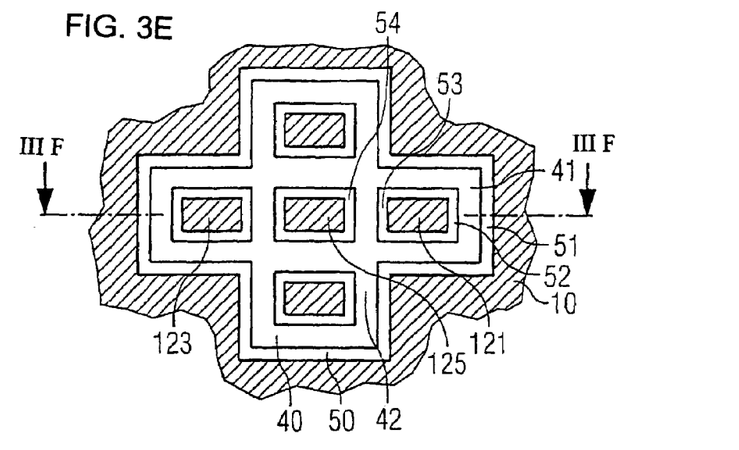
Figure 3F:
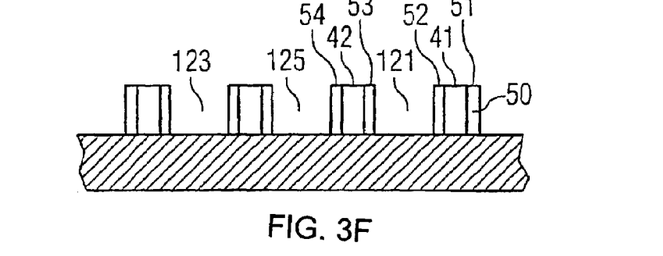
Figure 5A:
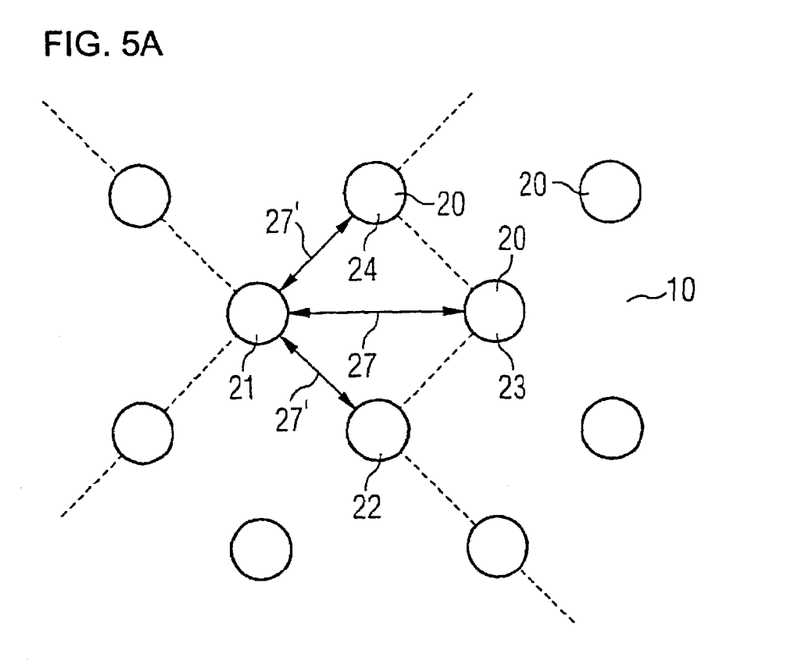
FIGS. 5A and 5B are illustrations showing a comparison of the hole structures produced lithographically with the hole structures of the hard mask that are produced therefrom in the method according to the invention.
Figure 5B:
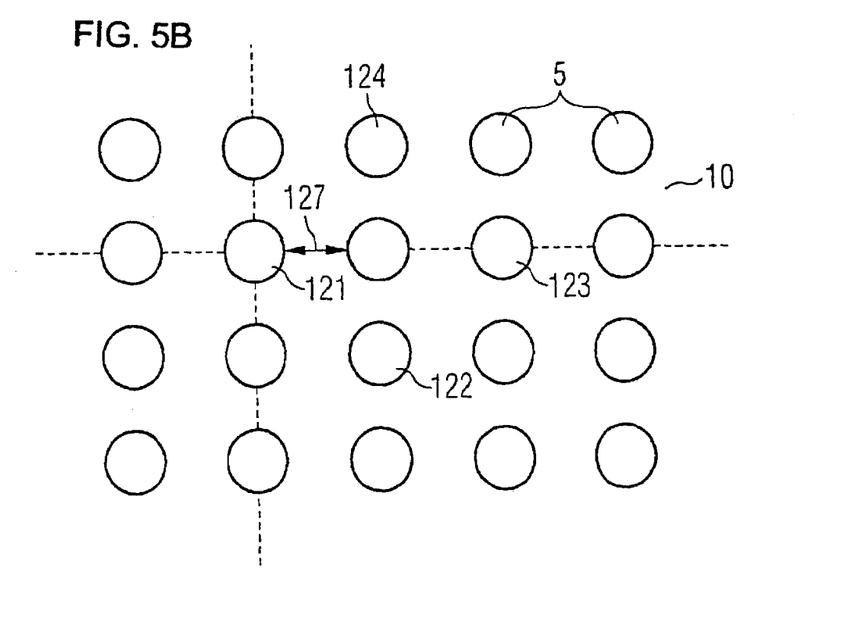

Since the structures 21–24 are disposed according to the invention in such a way that each of the structures has the same spacing 27' from two further structures, an initially unstructured interspace is produced in a quadrangle formed by the four structures. The formation of the spacer structures 41, 42, which are formed with the deposition thickness 49 such that the spacer structures 41, 42 are connected to one another, results in that a region 125 enclosed by the spacer structures 41, 42 forms within the quadrangle described. The region 125 thus forms a hole structure between the structures 21–24 enclosed by the spacer structures 41, 42. By selectively removing the second layer 20 between the spacer structures 41, 42, further hole structures 121, 123 are also formed at the locations of the previous structures 21–24. Widths of the hole structures 121, 123, 125 can be dimensioned further by depositing a fifth layer 50 (FIGS. 3E-3F). It follows as a particularly advantageous result, by contrast, that the hard mask formed by the spacer structures 41, 42, 51–54, which hard mask can also be transferred to the silicon nitride layer 10, has been formed from the originally four structures 21–24 now five hole structures 121–125 by the method according to the invention. If the structures 21–24 are now considered as an excerpt from a regularly disposed array of a multiplicity of structures, the result is a doubling of the density of hole structures on a wafer, for example, compared with the structures 21–24 originally formed lithographically on the first layer 10, as can be seen from the diagrammatic comparison of FIGS. 5A and 5B. It should be taken into consideration, however, that the grid orientation is rotated through 45 degrees in the case of the processing by the method according to the invention. Furthermore, it should be taken into account owing to the two-dimensional mode of consideration in this exemplary embodiment that the structure spacing 27 is no longer halved here, but rather is only divided by the factor $\sqrt{2}$. This example can advantageously be used to form dense memory cell arrays, as are planned particularly in the technology generations below 110 nm, namely in trench structures or memory cells disposed in a matrix-like fashion.

Figure 4A:
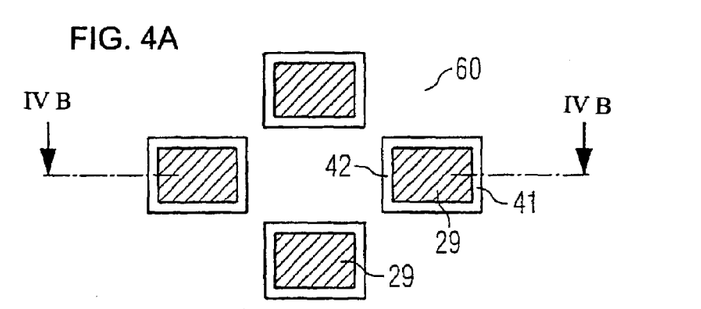
FIGS. 4A, 4C, and 4E are plan views of the third exemplary embodiment of the method according to the invention for forming the hard mask with the regular configurations of holes for patterning trenches in a memory cell array but on the basis of hole structures.

The same success can also be achieved on the basis of hole structures 29 formed in a fourth layer 60 formed, for example, from borophosilicate glass, as can be seen in FIG. 4A. The requirements made of the configuration of the hole structure 29 are the same as those made of the elevated structures 21–24. It should be noted, however, that in a memory cell array having a multiplicity of hole structures 29—or elevated structures 21–24—there is the condition that each of the structures has the same spacing from four further structures with the exception of those structures which are located at the edge of the memory cell array.

Figure 4B:
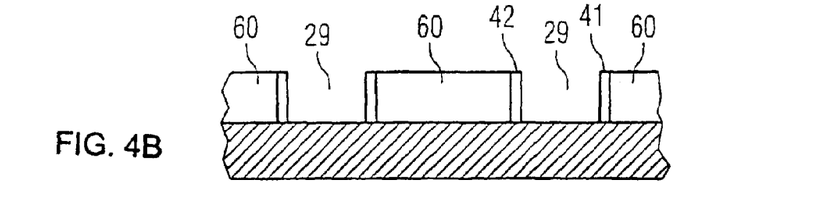
FIGS. 4B, 4D, and 4F are sectional views of the third exemplary embodiment of the method according to the invention for forming the hard mask with the regular configurations of holes for patterning trenches in the memory cell array, but on the basis of hole structures.
Figure 4C:
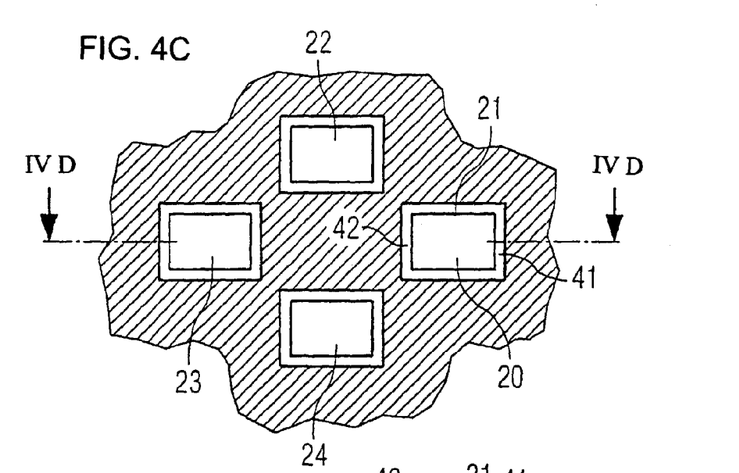
Figure 4D:
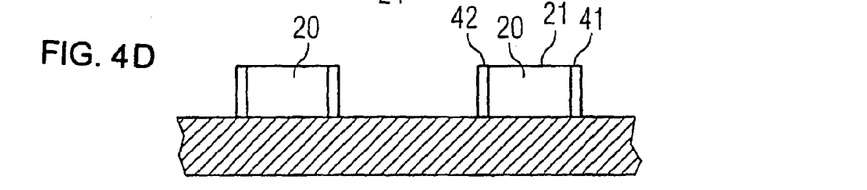
Figure 4E:
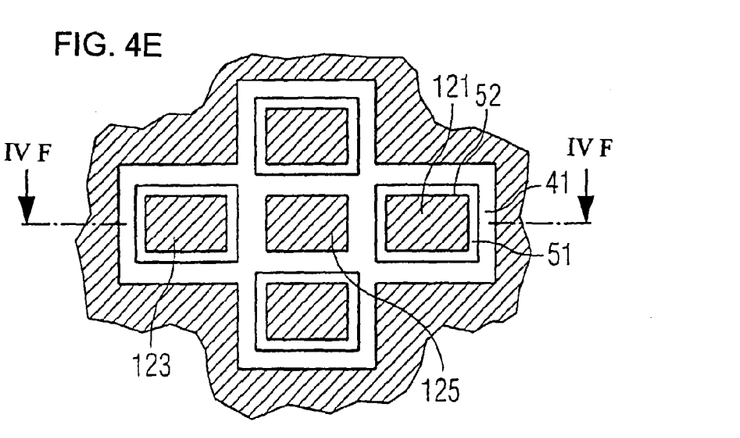
Figure 4F:
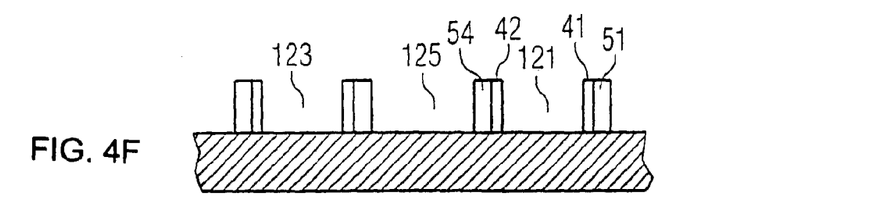

The third layer 40 is deposited conformally into the hole structures 29 and etched back, thereby forming spacer structures 41, 42 on the inner side areas of the hole structures 29 (FIG. 4B). The hole structures 29 are filled with a second layer 20 made of polysilicon, for example, and planarized in a chemical mechanical polishing process. The planarization process is ended on the borophosilicate glass. The silicate glass 60 is subsequently removed selectively with respect to the polysilicon and silicon oxide (FIGS. 4C and 4D). Afterward, silicon oxide is again deposited and etched back with an etching stop on the silicon nitride. Afterward, the polysilicon 20 is removed, so that the spacer structures are isolated on the silicon nitride of the first layer 10. In this method, too, proceeding from hole structures produced lithographically, an additional hole structure 125 is formed between the spacer structures 41, 42, 51, 54. In contrast to the method proceeding from the elevated structures, in the case of this aspect, the removal of the filling of the second layer 20 only after the second spacer formation enables the production of the spacer structures 51, 54 on only one side of the first and second spacer structures 41, 42. This simultaneously leads to a displacement of the center point of composite spacer structures.

We claim:

1. A method for forming a hard mask in a first layer on a planar device, which comprises the steps of:
    depositing a second layer on the first layer;
    using a lithographic projection process for forming at least one elevated first structure from the second layer disposed above the first layer;
    conformally depositing a third layer on the elevated first structure and on the first layer;
    etching back the third layer for forming a first spacer structure and a second spacer structure each disposed on a respective side area of the elevated first structure;
    etching the second layer selectively with respect to the first and third layers to remove the elevated first structure disposed between the first and second spacer structures,
    resulting in the hard mask being formed from the first and second spacer structures;
    depositing conformally a fifth layer on the first layer and on the first and second spacer structures; and
    etching back the fifth layer for forming a third spacer structure and a fourth spacer structure on a respective side of the first spacer structure and also a fifth spacer structure and a sixth spacer structure on a respective side of the second spacer structure.

2. The method according to claim 1, further comprising the steps of:
    removing the first spacer structure formed from the third layer between the third and fourth spacer structures using a selective etching step; and
    removing the second spacer structure formed between the fifth and sixth spacer structures using a further selective etching step.

3. The method according to claim 1, further comprising the steps of:
    forming the first layer from silicon nitride;
    forming the second layer from silicon oxide; and
    forming the third layer from polysilicon.

4. The method according to claim 1, further comprising the step of forming the third and fifth layers from a same material.

5. The method according to claim 1, which comprises during the lithographic projection process, forming an elevated second structure from the second layer, the elevated first and second structures have a given width and a mutual spacing there-between, the mutual spacing not being less than the given width and not being more than three times the given width.

6. The method according to claim 5, which comprises:
carrying out the depositing of the third layer with a first thickness; and
carrying out the depositing of the fifth layer with a second thickness, the first and second thicknesses being implemented in a manner dependent on the given width and the mutual spacing.

7. The method according to claim 6, which comprises:
forming the first thickness to be essentially half a difference between the mutual spacing and the given width of the first and second structures; and
forming the second thickness to be essentially an eighth of a difference between three times the given width and the mutual spacing.

8. The method according to claim 1, which comprises:
during the lithographic projection process, forming elevated second, third and fourth structures from the second layer before performing the step of etching the second layer, the elevated first to fourth structures are not disposed contiguously on the first layer and the elevated first structure has, in a first direction, a given spacing with respect to the elevated second structure and, in a second direction substantially perpendicular to the first direction, having the given spacing with respect to the elevated third structure; and
performing the etching of the second layer step to the first to fourth structures in a same way to form a hole structure enclosed by the third to sixth spacer structures of the fifth layer in the hard mask.

9. The method according to claim 8, which comprises:
providing a silicon substrate, the first layer bearing on the silicon substrate and is formed of silicon nitride;
forming the second layer from polysilicon;
forming the third layer and the fifth layer from silicon oxide; and
using the hard mask transferred to the first layer in an etching step for forming trench capacitors in a memory cell array.

10. The method according to claim 1, which comprises using one of a semiconductor wafer, a mask, and a flat panel as the planar device.

11. The method according to claim 1, further comprising the step of etching the first layer selectively with respect to the third layer, so that the first and second spacer structures are transferred to the first layer for forming a further hard mask.

12. A method for forming a hard mask in a first layer on a planar device, which comprises the steps of:
depositing a second layer on the first layer;
using a lithographic projection process for forming at least one elevated first structure from the second layer disposed above the first layer;
carrying out the lithographic projection process in a projection apparatus with a minimum resoluble structure width;
conformally depositing a third layer on the elevated first structure and on the first layer;
etching back the third layer for forming a first spacer structure and a second spacer structure each disposed on a respective side area of the elevated first structure;
producing at least one of the spacer structures transferred to the first layer with a given structure width, the given structure width being smaller than the minimum resoluble structure width of the projection apparatus; and
etching the second layer selectively with respect to the first and third layers to remove the elevated first structure disposed between the first and second spacer structures, resulting in the hard mask being formed from the first and second spacer structures.

13. A method for forming a hard mask in a first layer on a planar device, which comprises the steps of:
depositing a fourth layer on the first layer;
using a lithographic projection process for forming a hole structure in the fourth layer;
conformally depositing a third layer;
etching back the third layer for forming a first spacer structure and a second spacer structure on a respective side area of the hole structure;
depositing and filling the hole structure with a second layer;
planarizing the second layer;
etching the fourth layer selectively with respect to the first, second and third layers for forming an elevated first structure enclosed by the first and second spacer structures on the side areas; and
etching the second layer selectively with respect to the first and third layers for removing the elevated first structure between the first and second spacer structures, resulting in the hard mask being formed from the spacer structures.

14. The method according to claim 13, further comprising the steps of:
depositing conformally a fifth layer on the first layer and the spacer structures; and
etching back the fifth layer for forming a third and a fourth spacer structure on a respective side of the first spacer structure and also a fifth and a sixth spacer structure on a respective side of the second spacer structure.

15. The method according to claim 14, further comprising the steps of:
removing the first spacer structure formed from the third layer and disposed between the third and fourth spacer structures using a selective etching step; and
removing the second spacer structure disposed between the fifth and sixth spacer structures using a further selective etching step.

16. The method according to claim 14, further comprising the step of forming the third and fifth layers from a same material.

17. The method according to claim 14, which comprises during the lithographic projection process, forming an elevated second structure from the second layer, the elevated first and second structures have a given width and a mutual spacing there-between, the mutual spacing not being less than the given width and not being more than three times the given width.

18. The method according to claim 17, which comprises:
carrying out the depositing of the third layer with a first thickness; and
carrying out the depositing of the fifth layer with a second thickness, the first and second thicknesses being implemented in a manner dependent on the given width and the mutual spacing.

19. The method according to claim 18, which comprises:
forming the first thickness to be essentially half a difference between the mutual spacing and the given width of the first and second structures; and forming the second thickness to be essentially an eighth of a difference between three times the given width and the mutual spacing.

20. The method according to claim 14, which comprises: during the lithographic projection process, forming elevated second, third and fourth structures from the second layer before performing the step of etching the second layer, the elevated first to fourth structures are not disposed contiguously on the first layer and the elevated first structure has, in a first direction, a given spacing with respect to the elevated second structure and, in a second direction substantially perpendicular to the first direction, having the given spacing with respect to the elevated third structure; and performing the etching of the second layer step to the first to fourth structures in a same way for forming a hole structure enclosed by the third to sixth spacer structures of the fifth layer in the hard mask.

21. The method according to claim 20, which comprises: providing a silicon substrate, the first layer bearing on the silicon substrate and is formed of silicon nitride; forming the second layer from polysilicon; forming the third layer and the fifth layer from silicon oxide; and using the hard mask transferred to the first layer in an etching step for forming trench capacitors in a memory cell array.

22. The method according to claim 21, which comprises forming the fifth layer from borophosphosilicate glass.

23. The method according to claim 13, further comprising the steps of:
forming the first layer from silicon nitride;
forming the second layer from silicon oxide; and
forming the third layer from polysilicon.

24. The method according claim 13, further comprising the steps of:
carrying out the lithographic projection process in a projection apparatus with a minimum resoluble structure width; and
producing at least one of the spacer structures transferred to the first layer with a given structure width, the given structure width produced for the at least one spacer structure is smaller than the minimum resoluble structure width of the projection apparatus.

25. The method according to claim 13, which comprises using one of a semiconductor wafer, a mask, and a flat panel as the planar device.

26. The method according to claim 13, further comprising the step of etching the first layer selectively with respect to the third layer, so that the first and second spacer structures are transferred to the first layer for forming a further hard mask.

* * * * *